(12) United States Patent
Bleidistel et al.

(10) Patent No.: US 9,535,336 B2
(45) Date of Patent: Jan. 3, 2017

(54) MICROLITHOGRAPHIC PROJECTION EXPOSURE APPARATUS

(71) Applicant: Carl Zeiss SMT GmbH, Oberkochen (DE)

(72) Inventors: Sascha Bleidistel, Aalen (DE); Yim-Bun Patrick Kwan, Aalen (DE); Florian Bach, Oberkochen (DE); Daniel Benz, Winnenden (DE); Severin Waldis, Bern (CH); Armin Werber, Gottenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 246 days.

(21) Appl. No.: 14/285,094

(22) Filed: May 22, 2014

(65) Prior Publication Data

US 2014/0333912 A1 Nov. 13, 2014

Related U.S. Application Data

(63) Continuation of application No. 13/052,265, filed on Mar. 21, 2011, now Pat. No. 8,767,176, which is a (Continued)

(30) Foreign Application Priority Data

Sep. 30, 2008 (DE) .......................... 10 2008 049 556

(51) Int. Cl.
*G03B 27/42* (2006.01)
*G03F 7/20* (2006.01)
(Continued)

(52) U.S. Cl.
CPC .............. *G03F 7/702* (2013.01); *G02B 7/1827* (2013.01); *G02B 17/002* (2013.01);
(Continued)

(58) Field of Classification Search
CPC .............. G02B 26/0833; G02B 26/105; G02B 26/0816; G02B 26/0841; G02B 26/101; G02B 5/09; G02B 26/085; G02B 17/002; G02B 26/0825; G02B 26/0858; G02B 26/08; G02B 27/0068; G02B 27/1026; G02B 6/3518; G02B 6/3584; G03F 7/702; G03F 7/70825
See application file for complete search history.

(56) References Cited

U.S. PATENT DOCUMENTS

| 8,767,176 B2 | 7/2014 | Bleidistel et al. |
| 2005/0030653 A1 | 2/2005 | Holderer et al. |

(Continued)

FOREIGN PATENT DOCUMENTS

| EP | 1 865 359 | 12/2007 |
| JP | 2000-221421 | 8/2000 |
| WO | WO 02/10836 | 2/2002 |

OTHER PUBLICATIONS

The International Search Report for the corresponding PCT Application No. PCT/EP2009/006718, filed Apr. 1, 2010.
(Continued)

*Primary Examiner* — Mesfin Asfaw
(74) *Attorney, Agent, or Firm* — Fish & Richardson P.C.

(57) ABSTRACT

A microlithographic projection exposure apparatus has a mirror array having a base body and a plurality of mirror units. Each mirror unit includes a mirror and a solid-state articulation, which has at least one articulation part that connects the mirror to the base body. A control device makes it possible to modify the alignment of the respective mirror relative to the base body. Mutually opposing surfaces of the mirror and of the base body, or of a mirror support body connected to it, are designed as corresponding glide surfaces of a sliding bearing.

22 Claims, 8 Drawing Sheets

Related U.S. Application Data continuation of application No. PCT/EP2009/006718, filed on Sep. 17, 2009.

(60) Provisional application No. 61/101,281, filed on Sep. 30, 2008.

(51) Int. Cl.
*G02B 7/182* (2006.01)
*G02B 26/08* (2006.01)
*G02B 17/00* (2006.01)

(52) U.S. Cl.
CPC ...... *G02B 26/0833* (2013.01); *G03F 7/70116* (2013.01); *G03F 7/70291* (2013.01); *G03F 7/70891* (2013.01)

(56) References Cited

U.S. PATENT DOCUMENTS

| | | |
|---|---|---|
| 2006/0103908 A1 | 5/2006 | Loopstra et al. |
| 2007/0285638 A1 | 12/2007 | Ravensbergen et al. |
| 2008/0013097 A1* | 1/2008 | E. del Puerto ...... G03F 7/70041 356/500 |
| 2009/0009732 A1* | 1/2009 | Maeda ............... G02B 26/0841 353/99 |
| 2011/0181852 A1 | 7/2011 | Bleidistel et al. |

OTHER PUBLICATIONS

English translation and Chinese Office Action for corresponding application CN 2009-80138461.2, dated Mar. 14, 2013.

\* cited by examiner

MICROLITHOGRAPHIC PROJECTION EXPOSURE APPARATUS

CROSS-REFERENCE TO RELATED APPLICATIONS

This application is a continuation of, and claims benefit under 35 USC 120 to, U.S. application Ser. No. 13/052,265, Mar. 21, 2011, now U.S. Pat. No. 8,767,176, which is a continuation of, and claims priority under 35 USC 120 to international application PCT/EP2009/006718, filed Sep. 17, 2009, which claims benefit of German Application No. 10 2008 049 556.5, filed Sep. 30, 2008 and USSN 61/101,281, filed Sep. 30, 2008. U.S. application Ser. No. 13/052,265 and international application PCT/EP 2009/006718 are hereby incorporated by reference in their entirety.

FIELD

The disclosure relates to microlithographic projection exposure apparatus, and in particular to illumination systems or projection objectives of such apparatus having a mirror array, which has a base body and a plurality of mirrors that are arranged on the base body and can be tilted or otherwise modified in their alignment relative to the base body.

BACKGROUND

Integrated electrical circuits and other microstructured components are conventionally produced by applying a plurality of structured layers onto a suitable substrate which, for example, may be a silicon wafer. In order to structure the layers, they are first covered with a photoresist which is sensitive to light of a particular wavelength range, for example light in the deep ultraviolet (DUV) or extreme ultraviolet (EUV) spectral ranges. Conventional light wavelengths for DUV systems are currently 248 nm, 193 nm and sometimes 157 nm; EUV projection exposure apparatus currently use X-ray light with a wavelength of about 13.5 nm.

The wafer coated in this way is subsequently exposed in a projection exposure apparatus. A pattern of structures, which is arranged on a mask, is thereby imaged onto the photoresist with the aid of a projection objective. Since the imaging scale is generally less than 1, such projection objectives are often also referred to as reducing objectives.

After the photoresist has been developed, the wafer is subjected to an etching process so that the layer becomes structured according to the pattern on the mask. The photoresist still remaining is then removed from the other parts of the layer. This process is repeated until all the layers have been applied onto the wafer.

The performance of the projection exposure apparatus used is determined not only by the imaging properties of the projection objective, but also by an illumination system which illuminates the mask. To this end, the illumination system contains a light source, for example a laser operated in pulsed mode (DUV) or a plasma source (EUV), and a plurality of optical elements which generate light beams, converging on the mask at field points, from the light generated by the light source. The individual light beams desirably have particular properties, which in general are adapted to the projection objective and the mask to be imaged.

In order to be able to vary more flexibly the properties of the light beams striking the mask or the shape of the region illuminated on the mask, it has been proposed to use one or more mirror arrays, each having a plurality of adjustable mirrors, in the illumination system. The alignment of such mirrors is conventionally carried out by swiveling movements about one or two swivel axes. Such swiveling mirrors are therefore desirably fitted to suspensions which have one or two movement degrees of freedom. This may, for example, be achieved with solid-state articulations or with universal suspensions.

Mirror arrays, each having a plurality of adjustable mirrors, may also be used in projection objectives. For example, an array in a pupil plane of the projection objective may be envisaged in order to correct particular field-independent imaging errors.

The reflective layer systems, which are applied onto the supports of the adjustable mirrors, absorb an (albeit small) part of the incident light even in DUV projection exposure apparatus. In EUV projection exposure apparatus, the losses due to absorption are about 30%. The light absorbed by the mirrors heats them and, if sufficient dissipation of heat is not ensured, can lead to destruction of the reflective layer systems or other parts of the mirror units.

SUMMARY

The disclosure provides projection exposure apparatus having mirror arrays, in which the heat produced in the mirrors is dissipated particularly well so that overheating can reliably be avoided.

Subdivided Solid-State Articulation

According to a first aspect of the disclosure, a microlithographic projection exposure apparatus has a mirror array having a base body and a plurality of mirror units. Each mirror unit includes a mirror and a solid-state articulation, which has at least one articulation part that connects the mirror to the base body and is capable of bending in a plane of bending. A control device makes it possible to modify the alignment of the respective mirror relative to the base body. According to a first aspect of the disclosure, the articulation part is subdivided into a plurality of articulation elements that are spaced apart from each other in the plane of bending in order to reduce the flexural stiffness of the articulation part.

The spacing between the articulation elements may be very small. Small gaps between adjacent articulation elements may be filled with a liquid or a gas. The spacings may be so small that adjacent articulation elements even slightly touch each other. The plane of bending is generally arranged perpendicularly to a swivel axis around which the mirror is allowed to swivel.

This aspect of the disclosure is based on the idea that when solid-state articulations are used, components through which heat can be dissipated from the mirror by thermal conduction are already available. Utilising the solid-state articulation to dissipate heat from the mirrors is advantageous because, unlike other types of articulation, solid-state articulations do not have any gas- or liquid-filled gaps which can impede the heat transfer. The articulation parts of the solid-state articulation, however, generally have a very filigree design since otherwise the desired flexural properties cannot be achieved.

Owing to the inventive subdivision of the articulation parts into a plurality of mutually separated smaller articulation parts, it is possible to increase the articulation part's total cross section available for the heat flux without significantly modifying the flexural properties. This uses the effect that is known from subdividing a rod into a plurality of thin sub-rods that are spaced apart from each other in the plane of bending. Subdividing the rod then reduces its bending strength. If the bending strength is intended to remain constant after the subdivision, then additional sub-rods desirably are added, so that the total cross section and therefore the transferable heat flux are increased.

In one embodiment, the articulation elements are at least essentially arranged mutually parallel. Often, however, deviations from parallel are expedient so that the forces acting on the individual articulation elements can be adapted better to one another.

In another embodiment, the articulation elements are rod-shaped or plate-shaped. Rods and plates have well-defined flexural properties and are therefore particularly suitable as articulation elements.

In order to construct a solid-state articulation, two articulation elements may engage on the mirror while being mutually opposite. The mirror can then be swiveled in both directions about a swivel axis, which is established by the engagement points of the articulation elements.

The disclosure provides a method for developing a microlithographic projection exposure apparatus which has a mirror array that includes a base body and a plurality of mirror units, each of which has a mirror, a solid-state articulation which has at least one articulation part that connects the mirror to the base body, and a control device by which the alignment of the respective mirror relative to the base body can be modified. The method includes:
i) establishing a flexural stiffness which the articulation part should have;
ii) establishing a thermal conductivity which the articulation part should have;
iii) establishing a total cross section, which the articulation part should have in order to achieve the thermal conductivity established in step ii);
iv) establishing a number of mutually separated articulation elements which form the articulation part, such that the total set of articulation elements has the flexural stiffness established in step i) and the total cross section established in step iii).

Additional Thermal Conduction Elements

According to another aspect of the disclosure, a microlithographic projection exposure apparatus has a mirror array having a base body and a plurality of mirror units. Each mirror unit includes a mirror and a control device, by which the alignment of the respective mirror relative to the base body can be modified. According to the disclosure, the mirror units have thermal conduction elements which do not contribute to the bearing of the mirror, which are connected to the mirrors and which extend in the direction of the base body so that heat can be transferred from the thermal conduction elements to the base body.

This aspect of the disclosure is based on the idea that the heat transport from the mirror to the base body can be improved with the aid of additional thermal conduction elements, which are not part of the articulation.

The greatest heat flux is achieved when the thermal conduction elements are connected to the base body. In this case, the thermal conduction elements may be designed as flexible fibres or flexible bands which have a vanishingly small bending strength and therefore do not impede swiveling movements of the mirror. With a sufficiently large number of such thermal conduction elements, for example several hundred, it is nevertheless possible to provide a considerable total cross section overall through which the heat flux can pass.

It is however also possible not to connect the thermal conduction elements to the base body, so that the heat also travels through a preferably maximally small gap which is filled with a fluid or through which a fluid flows, in order to reach the base body. For example, it is conceivable to design the thermal conduction elements as essentially rigid bars. At least essentially rigid counter-elements may then protrude from the base body, which are separated from the thermal conduction elements only by a gap even during modifications of the alignment of the mirror.

As already mentioned, the gap width should be as small as possible since solids generally have a higher conductivity for heat than gases do. This applies particularly when the gas pressure is very low, as is desirable for EUV projection exposure apparatus. In these cases, the gap should have a gap width which is less than 1/10 of the maximum dimension of a reflective surface of the mirror.

In another embodiment, the bars and the counter-elements are arranged on the mirror and on the base body, respectively, so that they mutually engage in a comb-like fashion. Such an arrangement is advantageous because, overall, it provides a large surface area through which the heat can be transferred from the bars to the counter-elements.

If the bars and the counter-elements are configured in the form of cylinder wall segments and are arranged concentrically, then the gap width can remain constant even when the mirror is swiveled relative to the base body.

In particular silicon, a silicon compound, particularly silicon carbide, carbon or a metal, particularly copper, silver or gold may be envisaged as materials for the thermal conduction elements. These materials have a particularly high thermal conductivity and can also be processed well in precision mechanical applications.

The bars may also be used to provide an electrostatic drive, if the control device has a voltage source by which the bars can be electrostatically charged.

Fluidic Cooling

According to another aspect of the disclosure, a microlithographic projection exposure apparatus includes a mirror array. The mirror array has a base body and a plurality of mirror units, each of which has a mirror and a control device, by which the alignment of the respective mirror relative to the base body can be modified. According to the disclosure, the mirror units respectively have a flexible sealing mechanism which hermetically delimit a volume section between the mirror and the base body.

This aspect of the disclosure is based on the idea that, particularly in EUV projection exposure apparatus, it is not possible to select the pressure of the gas surrounding the mirror at such a high level that the gas can make a significant contribution to cooling the mirror. Immersing the mirrors in liquids is problematic, even in DUV projection exposure apparatus.

Yet by inventively providing a volume section between the mirror and the base body, which is delimited hermetically by the flexible sealing mechanism, this volume section can be filled with a gas or a liquid, or a gas or a liquid may flow through it, so as to make a significant contribution to cooling the mirrors.

In the simplest case, the volume section is filled once or at long time intervals with the liquid or gaseous fluid, which remains there. The heat flux is then provided essentially by thermal conduction in the stationery fluid.

An even higher cooling power will be achieved if the fluid is circulated in the volume section, so that the heat transport takes place primarily by convection. To this end, the volume section may have an inlet and an outlet. A circulation device, which may for example contain a pump and a heat exchanger, will be allocated to the mirror unit in order to circulate the fluid in the volume section.

If the sealing mechanism includes flexible sealing strips, which connect neighbouring mirrors to one another, then the fluid-tight volume section may extend over the entire space below the mirror and the rest of the sealing mechanism. The areas via which the mirrors come in contact with the fluid, and can thereby dissipate heat, will correspondingly be large.

If the fluid is a gas, it will preferably have a higher pressure in the volume section than a gas which is present on the other side of the sealing mechanism. This exploits the fact that the thermal conductivity of gases increases strongly with an increasing pressure. Increasing the gas pressure also has a favourable effect on the cooling power in the case of heat transport by convection.

In another embodiment, the sealing mechanism are bellows. This mirror unit will preferably have two bellows for each degree of freedom, which are arranged opposite one another. Symmetrical force conditions will thereby be provided when swiveling the mirror.

So that the bellows oppose swiveling with the least possible resistance, they may be connected together so that they communicate fluidically. In this context, for example, it may be feasible to connect the two bellows together by a channel which extends through the mirror.

If the control device has a device, in particular a displaceable piston or a pump, for modifying the fluid volume enclosed by a bellows, then it is also possible to use the bellows as actuation mechanism by which the alignment of the mirror relative to the base body can be modified. Additional actuators can then be obviated.

Sliding Bearing

According to another aspect of the disclosure, a microlithographic projection exposure apparatus includes a mirror array. The mirror array has a base body and a plurality of mirror units, each of which has a mirror and a control device, by which the alignment of the respective mirror relative to the base body can be modified. According to the disclosure, mutually opposing surfaces of the mirror and of the base body, or of a mirror support body connected to it, are designed as corresponding glide surfaces of a sliding bearing.

This aspect of the disclosure is based on the idea that the surfaces which bear on one another in sliding bearings are relatively large compared with solid-state articulations, so that the total achievable heat flux may be sufficient even if the heat transfer through the gap between the glide surfaces is impeded.

This heat transfer can be increased if at least one glide surface is provided with a lubricating and/or anti-wear coating, in particular with a metallization or with a diamond coating. Such coatings increase the contact area between the glide surfaces, and therefore improve the heat transfer.

A significant improvement in the heat flux can be achieved if a movement gap, which is at least partially filled with a paste or a fluid, in particular with a liquid, is formed between the corresponding glide surfaces. The liquid or paste prevents sizeable gas-filled cavities, which restrict the heat flux, from being formed in the movement gap.

Under certain circumstances, however, an increase in the heat flux may also be achieved with a gas-filled movement gap. If the gas is at a high pressure, for example, its thermal conductivity increases significantly. Here, a high pressure mechanism any pressure of more than 1.5 times the standard operating pressure which prevails in a space of the apparatus, through which projection light passes. If a gas flow is fed through the movement gap, then it can dissipate heat convectively.

In an advantageous embodiment, the control device is designed for variable adjustment of the width of the movement gap. In this way, for example, it is possible to keep the movement gap as small as possible and thereby increase the heat flux when the mirror is at rest. If the mirror is intended to be swiveled, the width of the movement gap will be increased shortly beforehand in order to achieve better sliding properties. Depending on the type of fluid contained in the movement gap, a similar effect may also be achieved by variable adjustment of an application pressure prevailing between the glide surfaces.

An additional improvement will be obtained if the glide surface of the base body or of the mirror support body has at least one exit opening for the fluid, from which the fluid can flow out into the movement gap. A fluid flowing in the movement gap allows additional dissipation of heat by convection.

In order to discharge the fluid again, the base body or the mirror support body may have at least one entry opening for the fluid, through which fluid circulating in the movement gap can flow out of the movement gap.

By suitable delivery of the fluid in the movement gap, it is possible to modify the flow direction of the fluid in the movement gap. This may in turn be exploited in order to exert a torque on the mirror and thereby swivel it.

Preferably, to this end the glide surface of the base body or of the mirror support body has at least two exit openings for the fluid, which lie diametrically opposite one another. Depending on which of the openings the fluid emerges from, a swiveling movement will be generated in one direction or the other.

In order to increase the torque which the fluid can exert on the mirror, the glide surface of the mirror may be provided with structures to increase the drag in relation to the fluid. Such structures may, for example, be bars or grooves which extend transversely to the flow direction.

A seal may furthermore be provided, which prevents the fluid emerging from a gap that remains between the mirror and the mirror support body.

The base body or the mirror support body may be prestressed relative to the mirror.

It is to be understood that the aspects of the disclosure as mentioned above may very substantially be combined with one another. For example, irrespective of the type of bearing, additional thermal conduction elements which extend from the mirror to the base body may always be provided. Furthermore, it is possible to provide fluidic cooling by using flexible sealing means irrespective of the type of bearing.

Further variants, in which all the aspects of the disclosure as described above may advantageously be employed, will be described below.

Thus, the control device may for example include at least one movement transducer arranged movably relative to the mirror, in particular a piezo or ultrasonic motor.

The movement transducer may bear flat on a mirror section in a resting state. In particular, the mirror and the movement transducer may have corresponding contact surfaces in the form of spherical cap segments. The sphere centres of the contact surfaces may be arranged in or at least in the immediate vicinity of an optical centre of the mirror. The term optical centre refers to the region of the mirror which the light actually strikes during operation of the apparatus. The optical centre therefore need not necessarily coincide with the geometrical centre.

In this case, the mirror may be coupled to the base body via a flexurally elastic and torsionally stiff spring element, in which case the spring element may in particular be designed as a (metal) bellows. The spring element may be elastically prestressed both in a neutral setting and in an excursion setting of the mirror and filled with a fluid, in particular with a liquid.

It is also preferable that the mirror can be swiveled about a swivel axis, which lies in or at least approximately in a reflection surface of the mirror. This will ensure that the shadowing of the mirrors is minimal even in the event of a swiveling movement of the mirror.

It is furthermore preferable that a sensor device for determining the alignment of the mirror should be allocated to the control device.

The disclosure may be used particularly advantageously when the radiation source is adapted for generating light with a wavelength shorter than 25 nm, in particular with a wavelength of about 13.5 nm. With these wavelengths, the light desirably only passes through volumes with very low gas pressures. Since gases conduct heat only poorly at low pressures, the solutions according to the disclosure have a particularly favourable effect on the cooling of the mirrors.

The solutions described above may be used advantageously not only in arrays having a plurality of mirror units, but also in microlithographic projection exposure apparatus which contain an adaptive mirror which can be deformed with the aid of a plurality of control units (actuators). Such an adaptive mirror may be regarded as an array of a plurality of mirror units, the individual mirrors of which are connected together by reflective material strips. The mirror units then consist essentially of the control units, by which the shape of the (common) mirror can be modified. The mirror array then corresponds to an array of control units which has a base body and a plurality of control units fastened on the base body, which engage on the mirror and by which the shape of the mirror can be modified.

Furthermore, another possible field of application involves projection exposure apparatus in which the total alignment of larger and not necessarily adaptively adjustable individual mirrors can be modified. For EUV projection objectives, for example mirrors, have been proposed which are mounted magnetically and therefore without any articulation which could contribute to dissipation of heat by thermal conductivity. Most of the aforementioned solutions may also be used advantageously for such "floating", or at least in part not physically supported mirrors. In the claims, the mirror array is then to be replaced with a mirror and a control device, by which the alignment of the mirror relative to a base body can be modified.

BRIEF DESCRIPTION OF THE DRAWINGS

Other features and advantages of the disclosure may be found in the following description of preferred embodiments with the aid of the drawing, in which.

DESCRIPTION OF THE PREFERRED EMBODIMENTS

Figure 1:
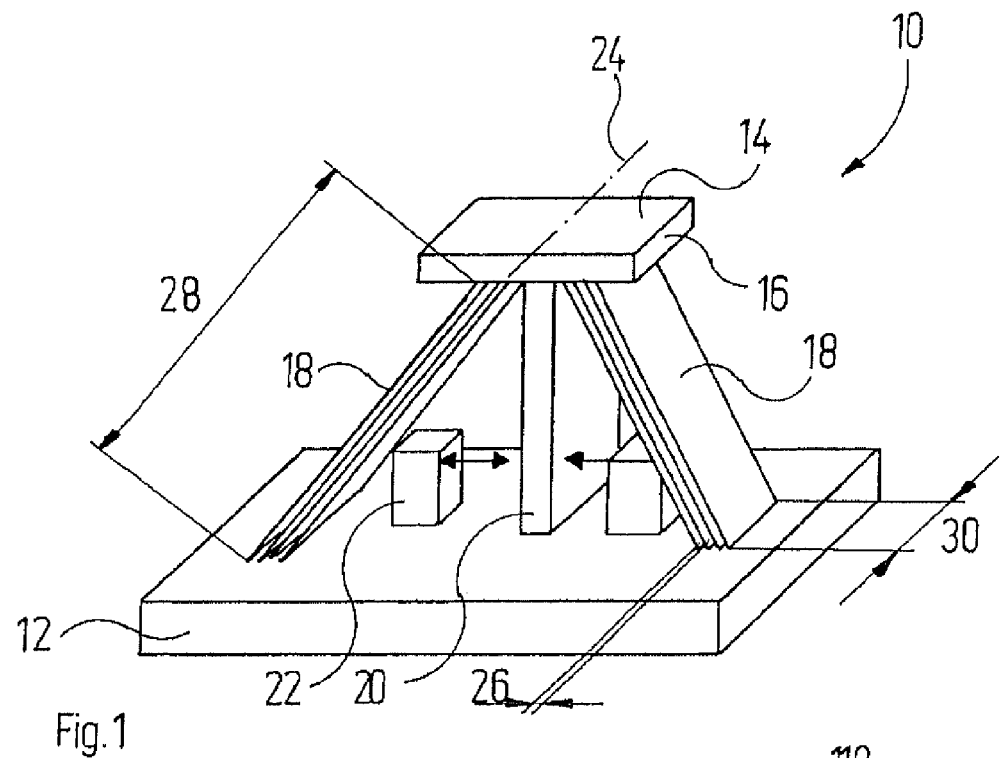
FIG. 1 shows a perspective representation of a swivellable mirror, which is suspended from a solid-state articulation formed by a plurality of leaf springs and having one degree of freedom for movement.

FIG. 1 shows in perspective representation a detail of a mirror unit 10, which is contained in an illumination system of a microlithographic projection exposure apparatus. The detail shown reveals a base plate 12 and a mirror unit that has a mirror 14, which is held on a T-shaped support body 16, and two groups of leaf springs 18 which are connected to the support body 16 and the base plate 12 and consist of a material with high thermal conductivity, for example steel, silicon, silicon carbide, copper, silver or gold. Together with the support body 16, the leaf springs 18 form a solid-state articulation for the mirror 14.

The mirror unit furthermore has two magnet coils 22 arranged between the leaf springs 18 and the longer limb of the support body 16. Of course, other actuators may also be used instead of the magnet coils. The mirror unit includes a plurality of the mirror units represented in FIG. 1, for example several hundred or even several thousand of them, which are arranged on the common base plate 12. The base plate 12 may also be curved, so that the mirrors 14 arranged next to one another likewise form a curved common mirror surface which is interrupted by the intermediate spaces between the mirrors 14.

In the embodiment shown, the leaf springs 18 arranged on the two sides of the support body 16 are respectively aligned mutually parallel. In other embodiments, the leaf springs 18 engage on each side of the support body 16 along a single line, so as to provide a fanlike arrangement in which the leaf springs 18 then only approximately extend mutually parallel.

The length of the longest limb 20 of the support body 16 is adapted to the length 28 and the angular alignment of the leaf springs 18 so that the support body 16 does not touch the base plate 12 either in the neutral setting of the mirror 14, as represented, or in an excursion setting (not shown). By electrically driving at least one of the two magnet coils 22, a force can be induced on the limbs 20 configured as permanent magnets, so that they bend. Owing to the effect of the leaf springs 18, the induction of force leads to a swiveling movement of the support body 16 about a swivel axis 24 which is shown. The leaf springs 18 arranged on one side of the support body 16, which may be regarded as firmly clamped in respect of their connection to the support body 16 and the base plate 12, then become locally curved and elastically deformed. On the opposite side, the leaf springs act essentially as tensile elements which are stressed in tension while being elastically deformed only slightly. The resistive moment against bending, generated by the leaf springs 18 in a plane of bending (not shown) is relatively small owing to the dimensioning of the thickness 26 of the leaf springs 18. The plane of bending is defined as a plane in which the leaf springs 18 are capable of bending. Consequently, the plane of bending is arranged perpendicularly to the swivel axis 24. In this plane of bending the leaf springs 18 are spaced apart from each other, as can be clearly seen in FIG. 1.

The dimensions and the number of the leaf springs 18 are selected so that the product of thickness 26, width 30 and number of the leaf springs 18 leads to a total cross section which is significantly greater than that of solid-state articulations, which instead of leaf springs 18 use elements that are monobloc but have the same bending strength as the leaf springs 18. Owing to the greater total cross section, the leaf springs 18 can dissipate more heat from the mirror 14 in the direction of the base plate 12 and thereby counteract overheating of the mirror 14. The subdivision of hitherto monobloc elements of solid-state articulations into a plurality of leaf springs 18 or other articulation elements exploits the fact that the bending strength of a component is reduced when it is subdivided into a plurality of individual parts, but the heat flux remains the same. By increasing the cross section of an articulation element, it is therefore possible to increase the heat flux which it can transport but to keep the bending strength constant owing to the subdivision into a plurality of articulation elements.

In this embodiment, as well as in the embodiments explained below, the base plate 12 may be provided with additional devices such as cooling fins or cooling channels in order to be able to dissipate better the heat absorbed from the mirrors. In addition or as an alternative, the base plate may be thermally coupled to a temperature sink.

Figure 2:
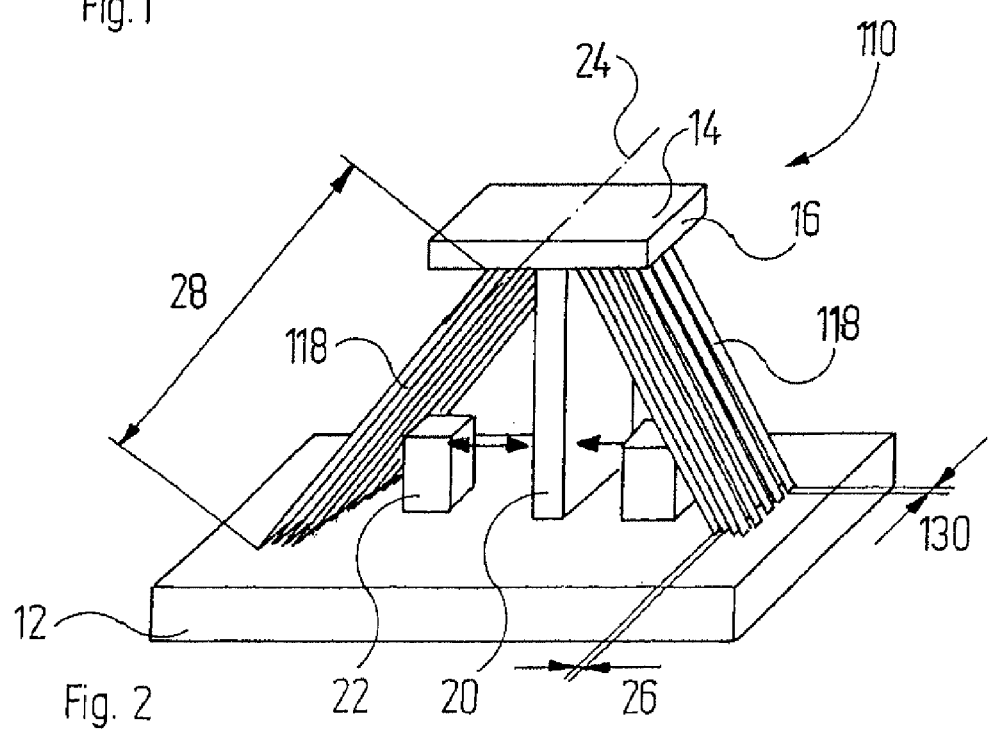
FIG. 2 shows a second embodiment of a swivellable mirror, which is suspended from a solid-state articulation formed by a plurality of leaf springs.

The embodiment of a mirror unit 110 according to FIG. 2 uses the references as in FIG. 1 respectively increased by 100 for functionally equivalent components, which also applies correspondingly for the further embodiments.

The leaf springs 118 according to FIG. 2 have a smaller width 130 in the direction of the swivel axis 24, compared with the leaf springs 18 according to FIG. 1. In order to ensure the desired stability of the solid-state articulation formed by the leaf springs 118, the number of leaf springs 118 is increased significantly compared with the number of leaf springs 18 according to FIG. 1. Five adjacently arranged groups, each of four leaf springs 118 aligned mutually parallel, extend on each side of the swivel axis 24. The total cross section and therefore the transportable heat flux of the leaf springs 118 is increased further in relation to the embodiment shown in FIG. 1, but without thereby modifying the bending strength significantly.

Figure 3:
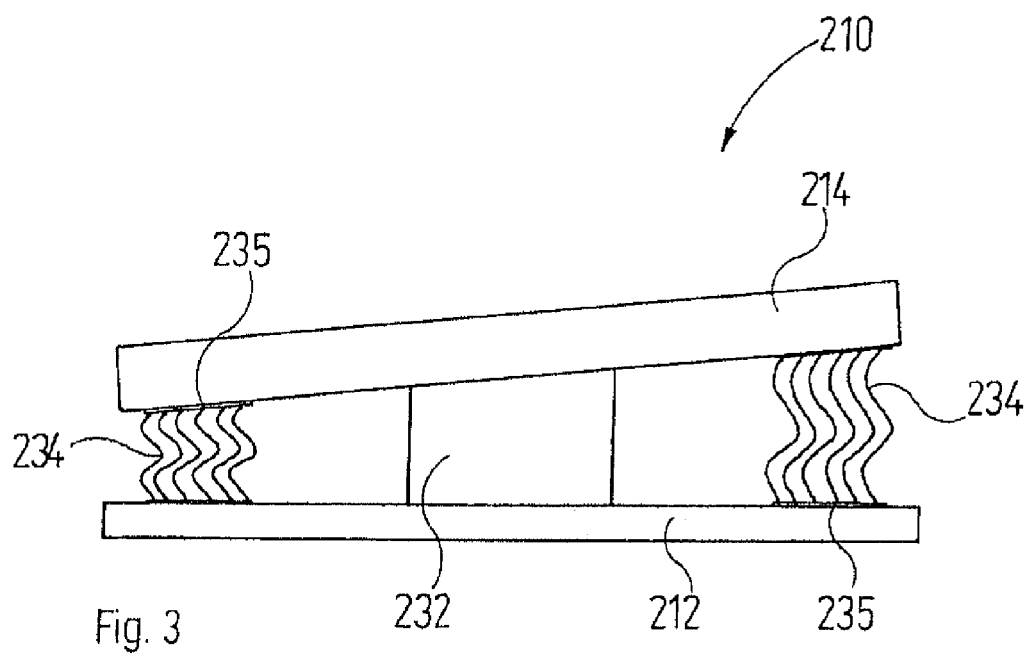
FIG. 3 shows a schematic representation of a swivellable mirror, to which metal filaments are allocated for thermal conduction.

FIG. 3 schematically represents a mirror unit 210 which includes a base plate 212, a cuboid mirror 214 and a flexion element 232, which is designed as a piezoelectric movement transducer. By applying electrical potentials to electrodes (not shown) of the flexion element 232, an excursion of the mirror 214 can be induced from a neutral position (not shown) into an excursion position represented in FIG. 3. So that the flexion element 232 can induce a sufficiently large swiveling angle for the mirror 214, it has a significantly smaller cross section in relation to the extent of the mirror 214. As a result of this cross section, only a part of the heat released by absorption of radiation in the mirror 214 can be dissipated into the base body 212.

In order to avoid overheating of the mirror 214, the mirror unit has metal filaments 234, first ends of which are thermally conductively connected to the mirror 214 (preferably in the vicinity of the circumference) and second ends of which are thermally conductively connected to the base plate 212. The metal filaments 234 allow dissipation of heat from the mirror 214 to the base plate 212. The diameter of the metal filaments 234 is so small that they have a high flexibility, i.e. negligible elastic properties. The metal filaments 234 therefore oppose swiveling movements of the mirror 214 with only a small resistance, which can readily be overcome by the flexion element 232. In order to improve the thermal coupling to the mirror 213 and the base plate 212, in this embodiment the metal filaments 234 are fastened on metal strips 235 which in turn are fitted flat on the mirror 213 and the base plate 212, respectively.

Instead of metals such as copper, silver or gold, it is also possible to use silicon, silicon compounds, in particular silicon carbide, or carbon as filamentary thermal conduction elements. The thermal conduction elements may also be in the form of bands or have other cross sections, so long as sufficient flexibility is ensured.

Figure 4:
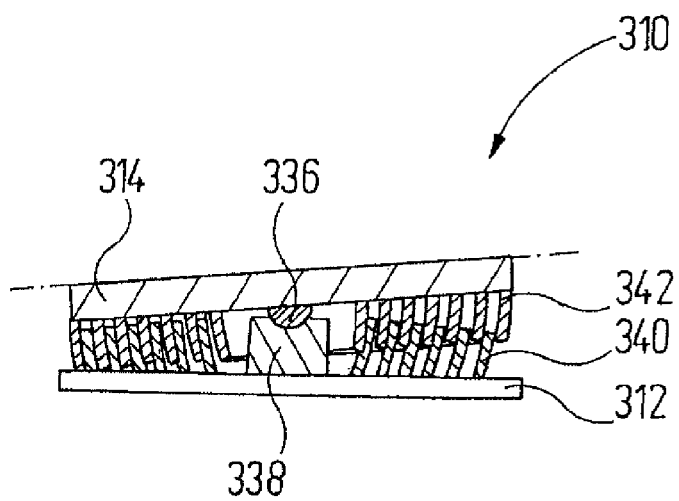
FIG. 4 shows a schematic sectional representation of a mirror with bars, which form an electrostatic drive, placed in touching contact.

In the mirror unit 310 according to FIG. 4, the mirror 314 is mounted so that it can be moved by swiveling via a bearing element 336 in the form of a spherical segment, which is held in a spherical cap-shaped recess of a bearing block 338. As a device for controlling the mirror 314 relative to the base plate 312, bars 340, 342 are provided which mutually engage in a comb-like fashion, are respectively fastened on the base plate 312 and on the mirror 314 and are divided (not shown) into four circular quadrants each with an angular extent of approximately 90 degrees. If swiveling can take place about only one swivel axis, then the bars 340, 342 may be in the form of cylinder wall segments as shown in FIG. 4. In the event that swiveling can take place about two orthogonal axes, the bars 340, 342 should either be very short or have no curvature with respect to the swivel axes.

The bars 340, 342 are respectively equipped with electrically insulating coatings (not shown), so that an electrostatic drive can be formed by applying different potentials to the bars 340, 342 arranged in the quadrants. By modifying the applied electrical potentials, this drive allows swiveling movement of the mirror 314 about two swivel axes aligned mutually perpendicularly. The bars 340, 342 also have the function of transferring the heat released by absorption of radiation from the mirror 314 to the base plate 312.

In the embodiment shown in FIG. 4, in which swiveling can take place about only one swivel axis, the bars 340, 342 may touch irrespective of the alignment of the mirror 314 so that they can transfer heat directly, i.e. via thermal conduction in solids, from one bar 340 to the adjacent bar 342. Owing to the multiplicity of relatively small bars 340, 342, a large surface area is available which can be used for heat transfer. In general, however, narrow gaps whose width may be less than $\frac{1}{10}$ of the maximum dimension of the reflective surface of the mirror 214 remain between the bars 340, 342. The heat transfer then takes place through the gas molecules contained in the gap. Given a sufficiently small gap width, a large heat flux is possible even when the gas pressure is very low, as is the case in EUV illumination systems. The advantage of bars sweeping along one another without touching is primarily to avoid frictional losses, which otherwise would involve higher control forces and correspondingly more elaborate driving.

Figure 5:
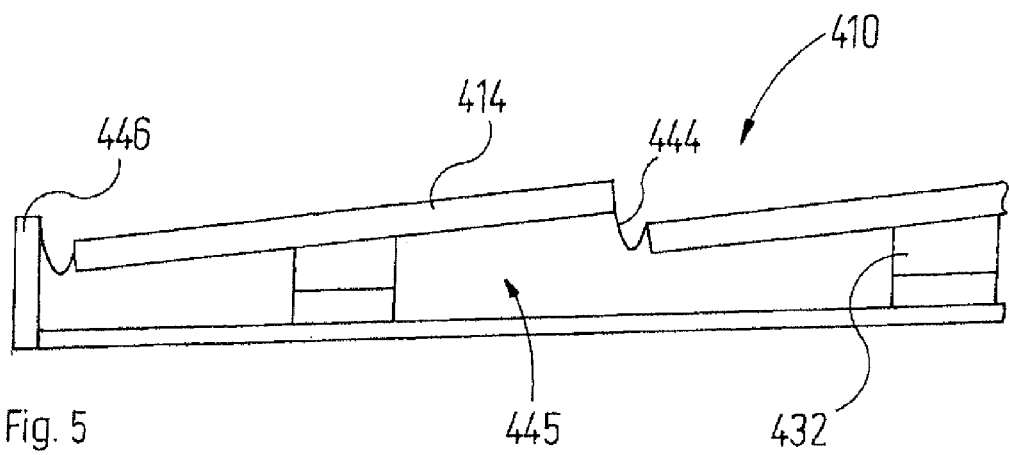
FIG. 5 shows adjacently arranged tiltable mirrors, which are connected together by flexible sealing membranes.

The mirror unit 410 having two mirrors 414, as represented in FIG. 5, has a similar structure to the mirror unit 210 represented in FIG. 3. In contrast to the mirror unit 210 according to FIG. 3, fluid cooling of the lower sides of the mirrors 414 is provided in the mirror unit 410 according to FIG. 5. In order to prevent the coolant from escaping into the radiation space lying above the mirrors 414, peripheral regions of the mirrors 414 are respectively connected to flexible sealing elements 444 which are fastened on neighbouring mirrors 414 or on wall regions 446. The sealing elements 444, made of thin-walled metal foil, allow mutual relative movement of the mirrors 414 and, together with the mirrors 414 and the base plate 412, delimit a closed volume section 445 in which a coolant can flow. The volume section may also be filled once with the coolant, which remains there permanently or over a prolonged period of time.

The coolant may be a liquid, for example mercury, water or gallium-indium-tin. In order to increase the thermal conductivity, metal particles may also be added to the liquid.

It is, however, also conceivable to use a gas as the coolant. The sealing elements 444 will then isolate the gaseous coolant placed at high pressure in the volume section 445 from the protective gas (which above all in EUV systems is at a very low pressure) that fills the volume on the other side of the sealing elements 444. So that the forces on the mirrors 414 and above all the sealing elements 444 do not become too large, however, the pressure difference between the two gases adjacent to the sealing elements 444 should not be too great. Yet since the thermal conductivity of gases increases approximately linearly with pressure at low pressures, even increasing the pressure by one or two powers of ten is sufficient to increase the thermal conductivity significantly.

The use of gaseous coolants is advantageous because flowing or stationary gases are simpler to manage than liquids. Furthermore, gaseous coolants create smaller frictional losses when tilting the mirrors 414. Liquid coolants, on the other hand, usually have better thermal conduction properties.

Figure 6:
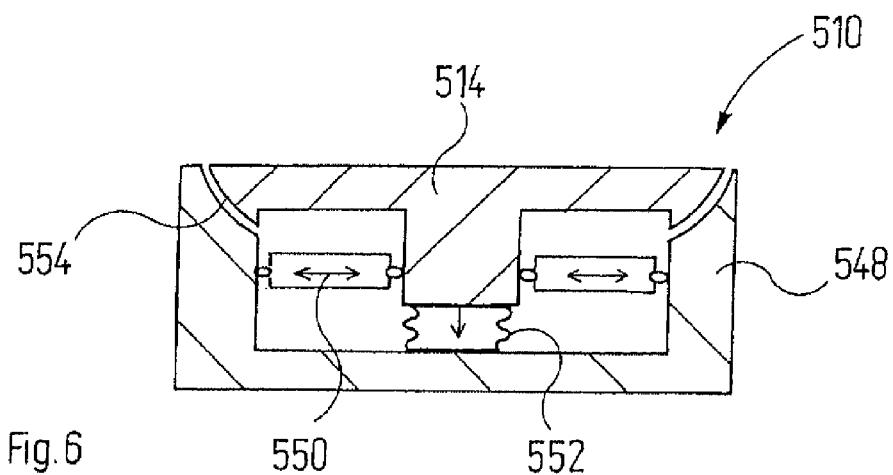
FIG. 6 shows a swivellable mirror prestressed by a prestressing device into an indentation in the form of a spherical cap.

The mirror unit 510 according to FIG. 6 includes a bearing element 548 designed in the form of a trough in which are arranged two piezo controllers 550 aligned mutually parallel and engaging on surfaces of a bar-like extension of the mirror 514, which face away from one another, and a flexible metal bellows 552 provided for exerting a tensile force on the mirror 514. A lower side of the mirror 514 and corresponding glide surfaces of the bearing element 548 are respectively designed in the form of cylinder segments and allow the mirror 514 to swivel in the plane of the drawing according to FIG. 6. The swiveling movement is induced by applying electrical potentials to the piezo controllers 550, the longitudinal extent of which can be modified in the direction of the arrows indicated according to the applied electrical potentials so that a corresponding torque is exerted on the mirror 514.

In the neutral setting of the mirror 514 as represented, the metal bellows 552 is prestressed downwards in the axial direction and therefore pulls the mirror 514 into the bearing element 548. Owing to the design of the metal bellows 552, it can jointly execute the swiveling movement of the mirror 514 in the plane of the representation according to FIG. 6, without thereby building up undesirably high restoring forces. The metal bellows 552 can be filled with a pressurised fluid through a liquid gland (not shown), so that the prestress of the metal bellows 552 is neutralised and a pressure force can be exerted on the mirror 514. This leads to the movement gap 554 clearly visible in FIG. 6 between the mirror 514 and the bearing element 548. When carrying out a control movement in the presence of the movement gap, virtually friction-free adjustment of the mirror 514 can be performed. After the end of the control movement, the pressurisation of the metal bellows 552 is reduced so that the mirror 514 returns to resting on the bearing element 548 in such a way as to transfer heat.

The movement gap 554 is preferably filled with a liquid or paste (not shown), for example an electro- or magneto-rheological liquid, a thermally conductive paste, a vacuum grease or an oil, in order to improve the heat transfer between the mirror 514 and the bearing element 548. The liquid compensates for surface roughness or fitting mismatches, and therefore avoids heat transfer being able to take place only through gas inclusions. For the same purpose, the mutually opposing surfaces of the mirror 514 and of the bearing element 548 may be made of a soft but thermally conductive material, for example indium, aluminium or copper, or provided with an inlay consisting of such a material. Coating with DLC (diamond-like carbon) also has a favourable effect on the achievable dissipation of heat.

Figure 7:
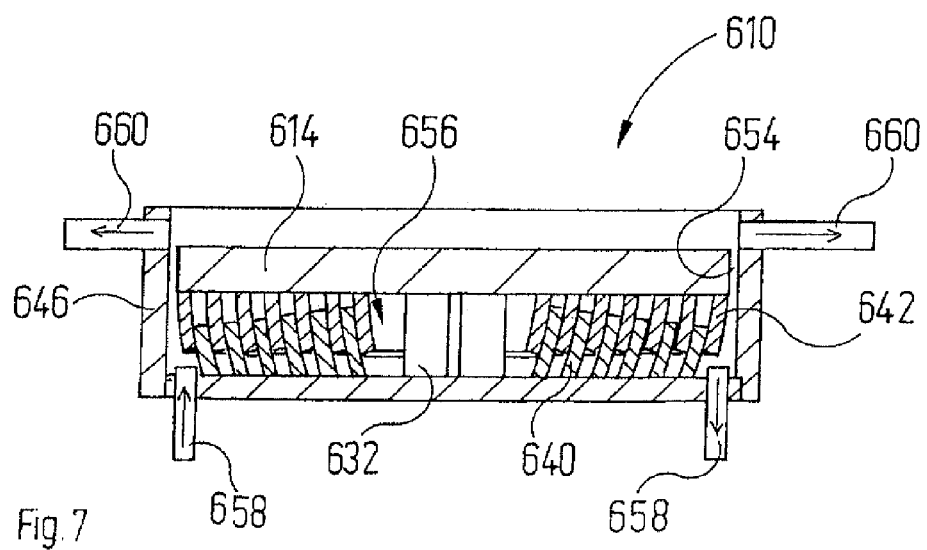
FIG. 7 shows a mirror cooled by gas on its rear side and held in a container designed in the form of a trough.

The mirror unit 610 represented in FIG. 7 has a similar structure to the mirror unit 310 represented in FIG. 4. However, the bars 640, 642 shaped like spherical sleeves are merely used for heat transfer between the mirror 614 and the base plate 612. An array of four flexion elements 632 arranged to form a square is provided as the control device, which allows a swiveling movement of the mirror 614 in two mutually perpendicular spatial directions. Lateral wall regions 646 are arranged on the base plate 612, which together with the base plate 612 and the mirror 614 delimit a fluid space 656 through which a coolant, for example a cooling gas such as hydrogen or a liquid such as mercury, gallium-indium-tin or water, can be fed. For supplying and discharging the coolant, connection glands 658 are arranged in the base plate 612. Suction glands 660 are also provided in the wall regions 646 above the mirror 614, which make it possible to suction coolant that may escape from the fluid space 656 through sealing gaps 654 and could lead to degradation of the optical properties in the vicinity of the mirror 614.

Figure 8:
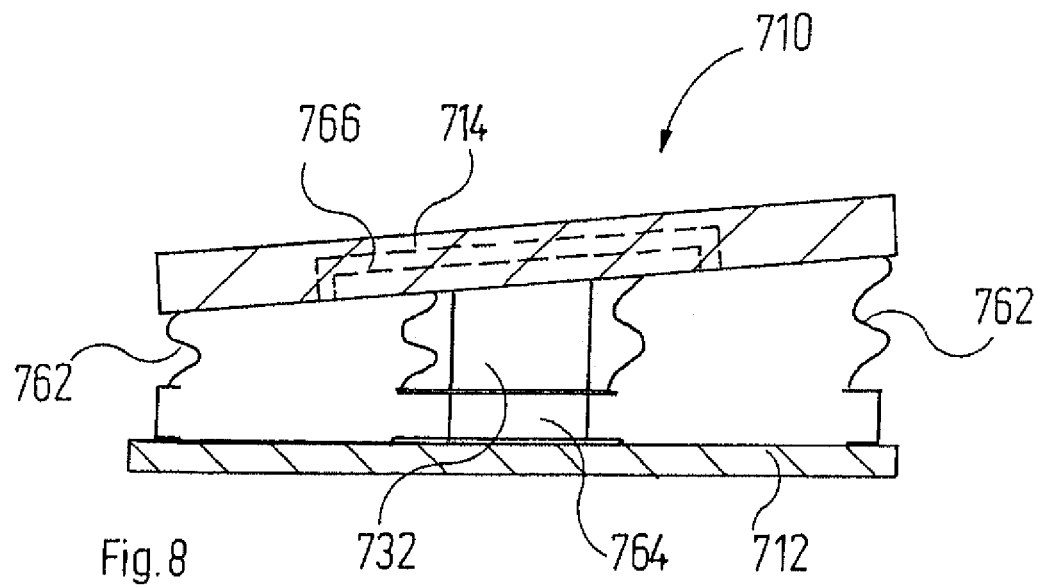
FIG. 8 shows a fluid-filled folding bellows arrangement disposed between a mirror and a base body.

In the mirror unit 710 according to FIG. 8, two folding bellows 762 are arranged between the mirror 714 and the base plate 712, which are filled with a liquid coolant and therefore improve heat transfer between the mirror 714 and the base plate 712. The flexion element 732 provided for swiveling the mirror 714 is equipped with a through-bore 764, which allows fluid exchange between the two folding bellows 762.

Instead of the through-bore 764, a channel 766 extending through the mirror 714 may also be provided for the purpose of fluid exchange as indicated by dashes in FIG. 8. In another variant, the coolant is circulated in the folding bellows 762 in order to permit even better dissipation of heat. To this end, the folding bellows 762 should be provided with inlet and outlet glands for the coolant (not shown).

Figure 9:
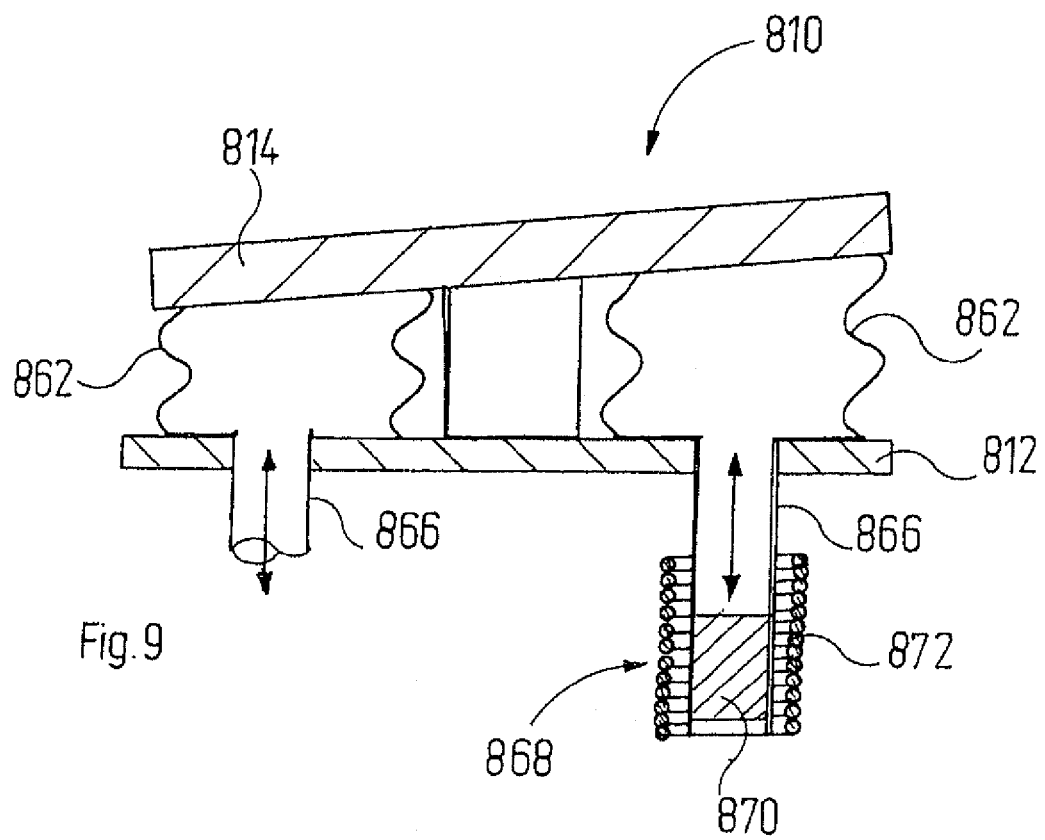
FIG. 9 shows a fluidic control device formed by folding bellows and arranged between a mirror and a base body.

Two separate folding bellows 862 are provided in the mirror unit 810 according to FIG. 9, which can be supplied with a pressurised fluid through respectively allocated liquid glands 866. Each of the liquid glands 866 is allocated an electromagnetic linear motor 868 which includes a permanent magnet 870 held linearly mobile in the liquid gland 866 and a coil 872, which is arranged coaxially with the permanent magnet 870 and to which an electrical voltage can be applied. Since the fluid volume in a folding bellows 862 and the respectively allocated liquid gland 866 is closed, a translational movement of the permanent magnet 870 leads to a volume variation in the liquid gland 866 which is compensated for by an opposite volume change in the folding bellows 862. The volume changes in one of the folding bellows 862 lead to tilting of the mirror 814.

Figure 10:
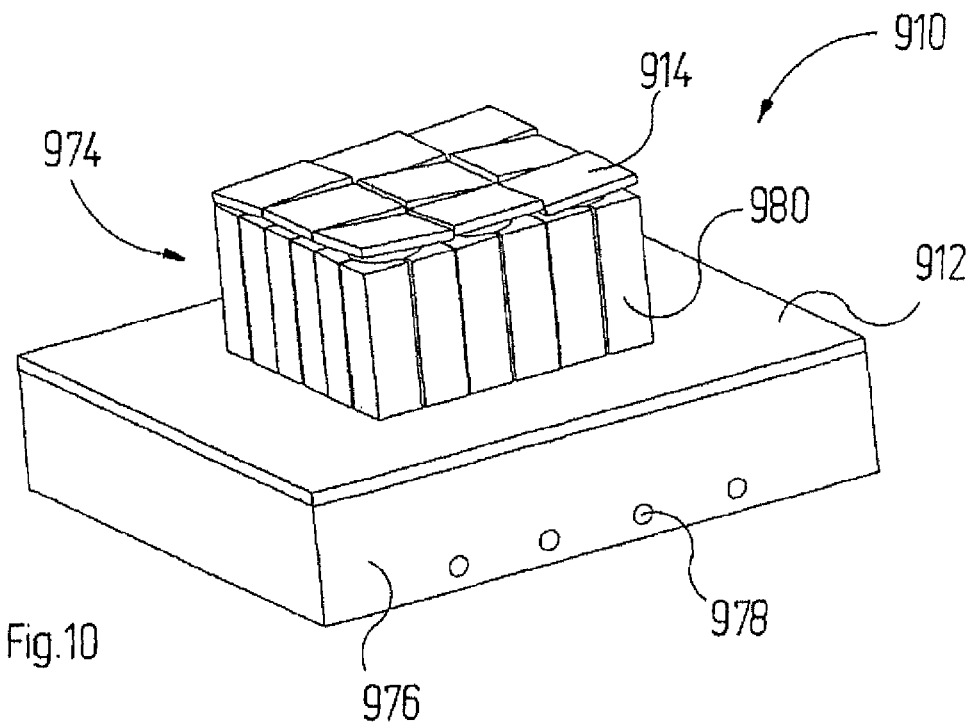
FIG. 10 shows a mirror array having nine mutually independently tiltable mirrors carried by piezo motors.
Figure 11:
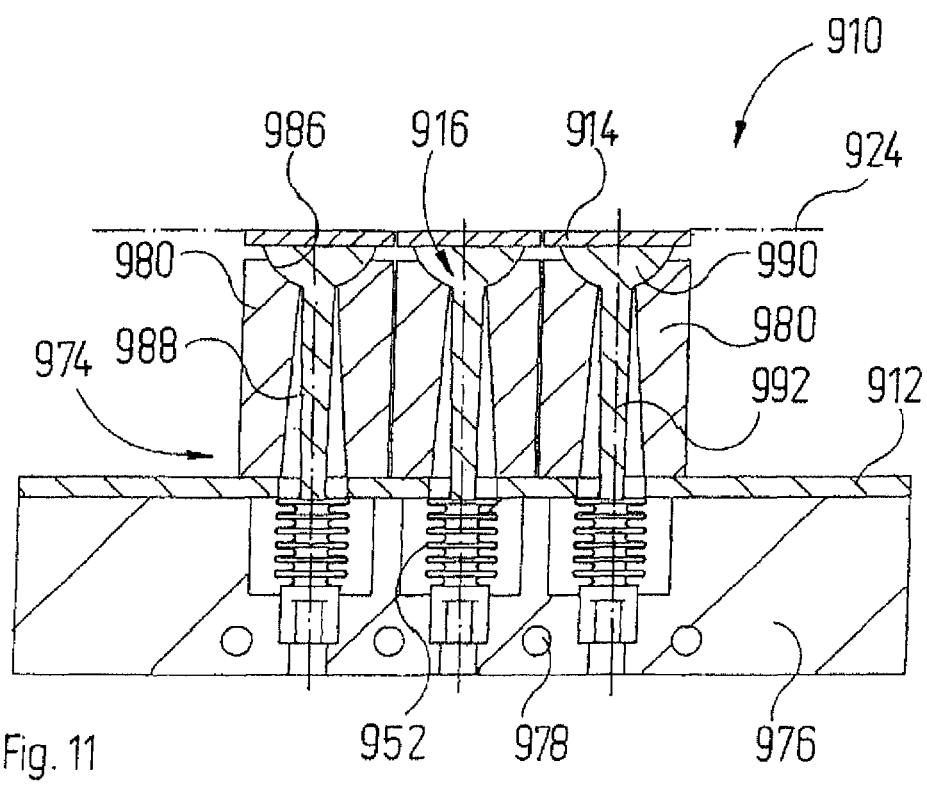
FIG. 11 shows a sectional representation of the mirror array according to FIG. 10.
Figure 12:
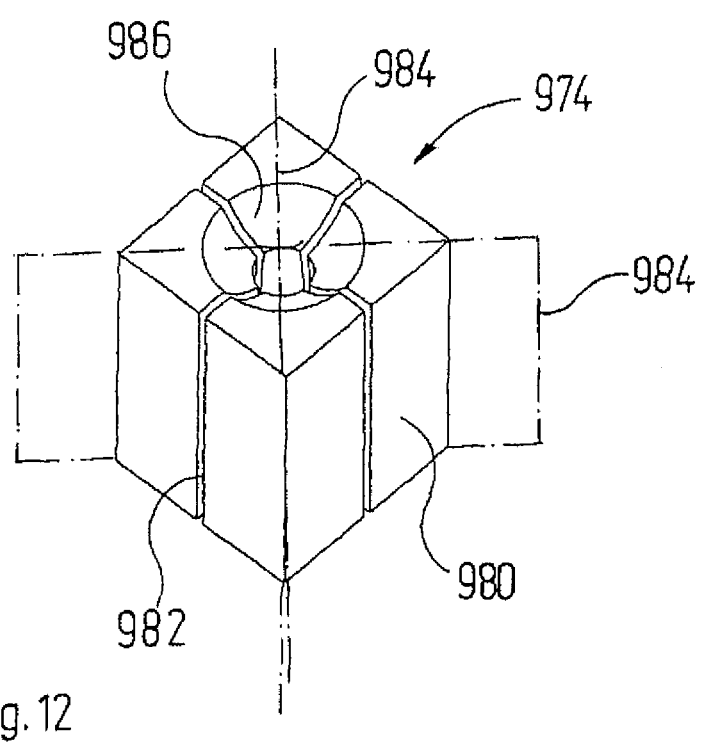
FIG. 12 shows a perspective representation of a piezo motor according to FIGS. 10 and 11.

The mirror unit 910 represented in FIGS. 10 to 12 includes a base plate 912 on which a total of nine tilting drives 974 are arranged, which allow tilting of allocated mirrors 914 in two mutually orthogonal spatial directions. Below the base plate 912, a heat sink 976 made of a material with high thermal conductivity is arranged, which has flow channels 978 for a coolant. Each of the tilting drives 974 has four ultrasonic transducers 980, which respectively have a square across section and are grouped so that, apart from movement gaps 982 remaining between neighbouring ultrasonic transducers 980, they form an array with a square cross section.

Each of the ultrasonic transducers 980 is designed as a piezoelectric flexion element. Respectively opposite ultrasonic transducers 980 can be deformed in a common bending plane 984, the bending planes of neighbouring ultrasonic transducers 980 being aligned mutually perpendicularly. An indentation 986 in the form of a spherical cap segment is respectively provided on an upper side of the ultrasonic transducers 980; the indentations 986 of the four ultrasonic transducers 980 which form a tilting drive 974 add together to form a virtually hemispherical indentation. On mutually opposing inner surfaces of the ultrasonic transducers 980, recesses are respectively provided in the form of conical segments which add together in the ultrasonic transducers 980 arranged to form a square to create a free space in the shape of a conical segment.

The mirror 914 is fitted on an axisymmetric support body 916. The latter has a region 990 in the form of a spherical segment, next to which there is a region 992 in the form of a conical segment. The region 990 in the form of a spherical segment rests flat on the surfaces of the indentations 986 of the ultrasonic transducers 980, as represented in detail in FIG. 11. The region 992 in the form of a conical segment is arranged in a free space formed by recesses 988 of the ultrasonic transducers 980, so that the support body 916 can be tilted in two mutually perpendicular spatial axes.

On the end of the region 992 in the form of a conical segment, a metal bellows 952 is arranged which is likewise designed axisymmetrically and is fastened on the heat sink 976 at an opposite end from the support body 916. Owing to the axisymmetric design of the metal bellows 952, it is rendered flexurally elastic and torsionally stiff so as to allow the support body 916 to swivel in two mutually perpendicular spatial directions, while rotation of the support body about the longitudinal mid-axis 994 is prevented by the torsional stiffness of the metal bellows 952. Making the bellows 952 from metal ensures that there are only parts which have a high thermal conductivity between the mirror 914 and the heat sink 976. If a particularly high thermal conductivity of the bellows 952 is desired, then nickel in particular may be envisaged as the metal. If however minimal stiffness is paramount as a selection criterion, then titanium may be suitable as the material for the bellows 952.

In order to tilt the mirror 914 about a swivel axis lying in the mirror surface, driving of mutually opposite ultrasonic transducers 980 is respectively provided. The oppositely arranged ultrasonic transducers 980 will be driven so that they bend at least essentially synchronously and in the same direction. This induces a tilting movement of the support body 916. The mutually opposite ultrasonic transducers 980 will then be driven so that they bend with slight shortening in the opposite direction. At this time, there is no contact of the correspondingly driven ultrasonic transducers 980 with the support body 916. Subsequently, by appropriate driving of the ultrasonic transducers 980, renewed contact with the support body 916 is established and the mutually opposite ultrasonic transducers 980 can again be deformed in the desired direction by once more applying electrical energy. A stepwise tilting movement of the support body 916, and the mirror 914 arranged on it, therefore takes place overall. Owing to this relative mobility of the ultrasonic transducers 980 with respect to the support body 916, the maximum swivel angle for the mirrors 914 is restricted merely by the design geometry of the interacting components. A suitable configuration can allow tilting of the mirror 914 in the range of up to +/−15 degrees.

In the neutral setting as represented in FIG. 11, the metal bellows 952 is already prestressed in the axial direction and therefore exerts a tensile force on the support body 916, so that the latter rests flat in the indentations 986 of the ultrasonic transducers 980. In order to improve the dissipation of heat from the mirrors 914 in the direction of the heat sink 976, a fluid, preferably a cooling gas, may flow through the movement spaces provided in the region of the metal bellows 952 and between the support body 916 and the ultrasonic transducers 980. In this case, the movement gaps 982 between the ultrasonic transducers 980 may be closed by elastic sealing materials so as to create a closed fluid channel from which the fluid cannot escape in the direction of the mirrors 914. A fluid may also flow through the metal bellows 952 itself, in order to further increase the thermal conduction between the mirror 914 and the heat sink 976.

Figure 13:
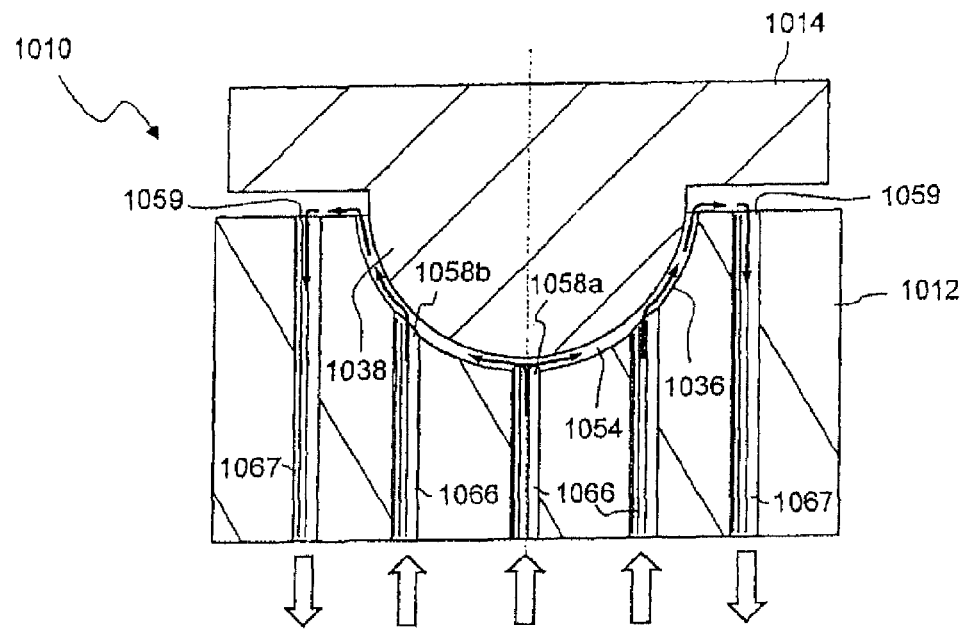
FIG. 13 shows an axial section through a mirror unit having a liquid-filled movement gap.
Figure 14:
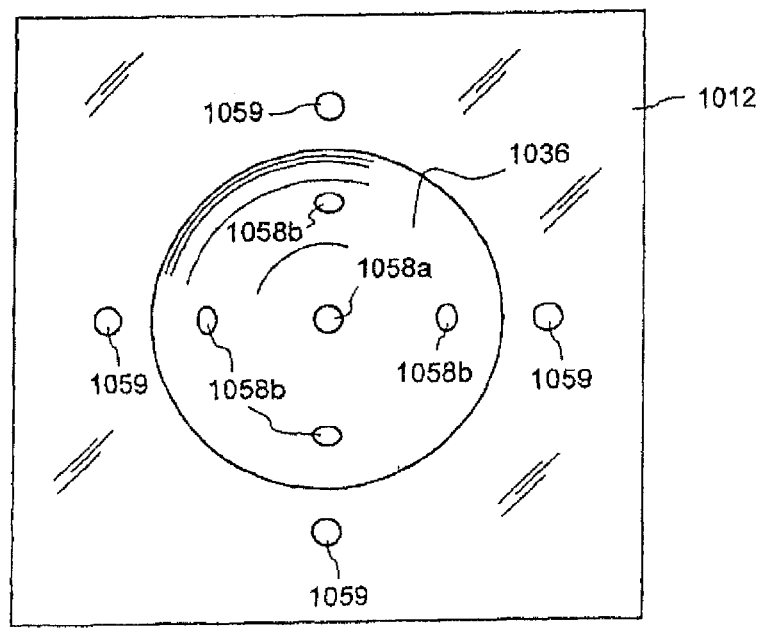
FIG. 14 shows a plan view of a base body of the mirror unit shown in FIG. 13.

FIGS. 13 and 14 show a mirror unit 1010 according to another embodiment, respectively in an axial section and a plan view of a mirror support body 1012 of the mirror array 1010. The mirror support body 1012, which may be connected to a base body carrying a plurality of mirror units or formed integrally thereon, has a recess 1036 in the form of a spherical cap that corresponds with a bearing element 1038 in the form of a spherical segment, which is fastened on the mirror 1014 or is formed integrally thereon. Between the mutually opposing curved surfaces of the mirror support body 1012 and of the bearing element 1038, a movement gap 1054 through which a liquid (not shown in detail) flows is left during operation of the projection exposure apparatus. To this end, in the embodiment represented in which swiveling can take place about two swivel axes, a total of five exit channels 1066 and four entry channels 1067 are incorporated in the mirror support body 1012. The exit channels 1066 open in the region of the recess 1036 into a central exit opening 1058*a* and into four off-centre exit openings 1058*b*. The entry openings 1059 for the four entry channels 1067 lie outside the recess 1036 in this embodiment.

Arrows in FIG. 13 indicate the flow direction of the liquid in the movement gap 1054.

The liquid flows out of the central exit opening 1058a and the off-centre exit openings 1058b, fills the movement gap 1054 uniformly and finally flows a way over the circumferential edge of the recess 1036 in order to re-enter the mirror support body 1012 through the entry openings 1059.

Owing to the liquid contained in the movement gap 1054, better heat transfer from the mirror 1014 to the mirror support body 1012 is achieved than would be the case with the mutually corresponding curved surfaces sliding directly on one another. Furthermore, the liquid functions as a heat exchange medium which absorbs heat from the mirror 1014 and dissipates it through the entry channels 1067 to a thermal sink (not shown). By suitable selection of the liquid and the ambient conditions, it is furthermore possible to make the liquid partially evaporate and thereby cool the mirror 1014. Evaporated liquid may be suctioned with the aid of additional suction openings (not shown in FIGS. 13 and 14). This will prevent evaporated liquid from entering regions through which projection light passes and degrading the optical properties of the illumination system.

The thin liquid film in the movement gap 1054 furthermore reduces the friction in a similar way to a lubricant, when the mirror 1014 is being swiveled relative to the mirror support body 1012.

In this case, it may be favourable to prestress the mirror 114 relative to the mirror support body 1012. The prestressing may be generated contactlessly, for example under the effect of magnetic forces, or with the aid of elastic elements such as springs or bellows.

Such bellows may also be used as a seal, in order to reliably prevent the liquid emerging from the gap between the mirror 1014 and the mirror support body 1012. Preferably, in this case, the bellows hermetically enclose all regions conveying the liquid, i.e. the movement gap 1054, the entry openings 1059 and the exit openings 1058a, 1058b.

In another embodiment, entry openings 1059 are also arranged inside the recess 1036, for example next to its circumferential edge. In order to prevent the liquid from flowing away over the upper edge of the recess 1036, a ring-like bar concentrically enclosing the recess 1036 may be formed on the plane upper side of the mirror support body 1012. The bar locally reduces the width of the movement gap 1054, so that it is not so easy for the liquid to escape from the movement gap 1054.

It is, however, also conceivable to provide an annular entry opening, preferably centred with respect to the recess 1036, so that the liquid can be discharged over a large area.

The liquid flowing in the movement gap 1054 may also be used to induce swiveling movements of the mirror 1014 relative to the mirror support body 1012. This will utilise the friction between the flowing liquid and the bearing element 1038, which leads to a torque on the mirror 1014. In order to reinforce this effect, measures may be instigated in order to increase the drag of the surface of the bearing element 1038.

Figure 15:
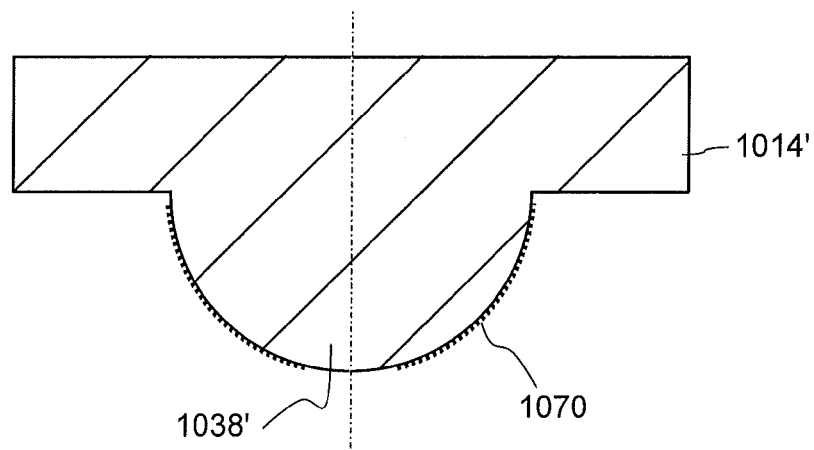
FIG. 15 shows an axial section through a mirror according to a variant of the mirror unit shown in FIG. 13.

FIG. 15 shows an axial section of a variant, denoted by 1014', of the mirror 1014 shown in FIG. 13. In this variant the bearing element 1038' formed on the mirror 1014' is provided with structures 1070 to increase the drag on its curved surface. The structures 1070 may for example be fine ribs, which extend transversely to the flow direction of the liquid and thereby generate an increased drag.

Figure 16:
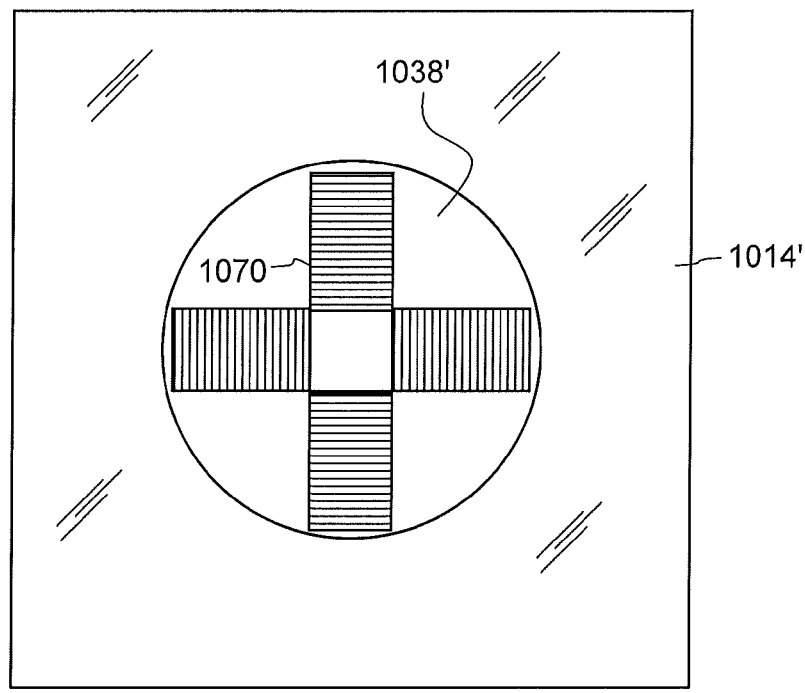
FIG. 16 shows a view from below of the mirror shown in FIG. 15.

An expedient arrangement of such rib-like structures 1070 is shown in the view from below of the mirror 1014' presented in FIG. 16. If a liquid flows out only from one of the off-centre entry openings 1058b, then the emerging liquid will sweep over the structures 1070 and generate a torque on the mirror 1014', which causes it to swivel. In order to swivel the mirror back again, liquid will be introduced into the movement gap 1054 (exclusively) through the entry opening 1058b respectively lying diametrically opposite. By modifying the flow direction of the liquid in the movement gap 1054, it is therefore possible to exert forces on the mirror 1014' which lead to swiveling about the desired swivel axis.

It is to be understood that a gas may also be used instead of a liquid in the embodiments shown in FIGS. 12 to 15.

What is claimed is:

1. An optical system, comprising:
   a mirror array, comprising:
      a base body;
      a plurality of mirror units supported by the base body, each mirror unit comprising:
         a mirror; and
         a solid-state articulation comprising first and second articulation parts, each articulation part connecting the mirror to the base body, each articulation part being capable of bending in a plane of bending, and each articulation part being subdivided into a plurality of articulation elements that are spaced apart from each other in the plane of bending to reduce a flexural stiffness of the at least two articulation parts; and
   a control device configured to modify an orientation of the mirror relative to the base body,
   wherein the optical system is a projection objective of a microlithographic projection exposure apparatus or an illumination system of a microlithographic projection exposure apparatus.

2. The optical system of claim 1, wherein, for each mirror unit, the articulation elements of each of the first and second articulation parts extend at least substantially parallel to each other.

3. The optical system of claim 1, wherein the articulation elements comprise rods.

4. The optical system of claim 1, wherein the articulation elements comprise plates.

5. The optical system of claim 1, wherein the first and second articulation parts are arranged on opposite sides of a plane of symmetry of the mirror.

6. The optical system of claim 5, wherein the first and second articulation parts are arranged mirror symmetrically with respect to the plane of symmetry of the mirror.

7. The optical system of claim 1, wherein each mirror unit comprises flexible thermal conduction elements extending between the mirror and the base body.

8. The optical system of claim 1, wherein at least a portion of the control device is arranged between the first and second articulation parts.

9. The optical system of claim 1, further comprising a third articulation part between first and second articulation parts, wherein the third articulation part is shorter, but thicker than the articulation elements.

10. The optical system of claim 1, wherein the mirror is configured to swivel about a swivel axis that lies at least substantially in a reflection surface of the mirror.

11. The optical system of claim 1, wherein each mirror unit comprises a sensor device configured to determine the orientation of the mirror with respect to the base body.

12. The optical system of claim 1, wherein the mirror is configured to reflect light having a wavelength shorter than 25 nm.

13. The optical system of claim 12, wherein the mirror is configured to reflect light having a wavelength of about 13.5 nm.

14. An apparatus, comprising:
the optical system of claim 1,
wherein the apparatus is a projection exposure apparatus.

15. The apparatus of claim 14, further comprising a light source configured to produce light having a wavelength shorter than 25 nm.

16. The projection exposure apparatus of claim 15, wherein the light source is configured to produce light having a wavelength of about 13.5 nm.

17. An optical system, comprising:
a mirror;
a base body;
a solid-state articulation connecting the mirror to the base body; and
a control device configured to modify an orientation of the mirror relative to the base body,
wherein:
the solid-state articulation is subdivided into a plurality of mutually parallel articulation elements that are rod-shaped or plate-shaped;
the articulation elements are spaced apart from each other in a plane of bending to reduce a flexural stiffness of the solid-state articulation;
a portion of the control device is arranged between at least two of the articulation elements;
the portion of the control device is configured to contactlessly exert electromagnetic forces on the mirror; and
the optical system is a projection objective of a microlithographic projection exposure apparatus or an illumination system of a microlithographic projection exposure apparatus.

18. A method, comprising:
providing a mirror array comprising a base body and a plurality of mirror units supported by the base body, each mirror unit comprising a mirror and an articulation part that connects the mirror to the base body,
determining a target flexural stiffness that for the articulation part;
determining a target thermal conductivity that for the articulation part;
determining a total cross section that the articulation part should have to achieve the target thermal conductivity; and
determining a number of mutually separated articulation elements which define the articulation part so that an entirety of all articulation elements has the target flexural stiffness and the total cross section.

19. The method of claim 18, wherein the articulation elements defining the articulation part extend at least substantially parallel to each other.

20. The method of claim 18, wherein the articulation elements comprise rods.

21. The method of claim 18, wherein the articulation elements comprise plates.

22. The method of claim 18, wherein each mirror unit comprises a control device configured to modify an orientation of the mirror relative to the base body.

* * * * *

UNITED STATES PATENT AND TRADEMARK OFFICE
CERTIFICATE OF CORRECTION

PATENT NO.        : 9,535,336 B2
APPLICATION NO.   : 14/285094
DATED             : January 3, 2017
INVENTOR(S)       : Bleidistel et al.

It is certified that error appears in the above-identified patent and that said Letters Patent is hereby corrected as shown below:

In the Specification

Column 6, Line 55, delete "very".

Signed and Sealed this
Second Day of May, 2017

Michelle K. Lee
*Director of the United States Patent and Trademark Office*